(12) United States Patent
Wu et al.

(10) Patent No.: US 10,170,441 B1
(45) Date of Patent: Jan. 1, 2019

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chih-Wei Wu, Yilan County (TW); Ying-Ching Shih, Hsinchu (TW); Szu-Wei Lu, Hsinchu (TW); Jing-Cheng Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/881,133

(22) Filed: Jan. 26, 2018

Related U.S. Application Data

(60) Provisional application No. 62/582,498, filed on Nov. 7, 2017.

(51) Int. Cl.
 *H01L 23/544* (2006.01)
 *H01L 23/00* (2006.01)

(52) U.S. Cl.
 CPC ............ *H01L 24/17* (2013.01); *H01L 23/544* (2013.01); *H01L 24/11* (2013.01); *H01L 24/16* (2013.01); *H01L 24/81* (2013.01); *H01L 2223/54426* (2013.01); *H01L 2224/11013* (2013.01); *H01L 2224/16501* (2013.01); *H01L 2224/1703* (2013.01); *H01L 2224/17177* (2013.01); *H01L 2224/17181* (2013.01); *H01L 2224/17515* (2013.01); *H01L 2224/81007* (2013.01); *H01L 2224/81024* (2013.01)

(58) Field of Classification Search
 CPC ....... H01L 23/544; H01L 24/11; H01L 24/16; H01L 24/17; H01L 24/81
 USPC .......................................................... 257/797
 See application file for complete search history.

(56) References Cited

U.S. PATENT DOCUMENTS

| | | | |
|---|---|---|---|
| 7,954,234 B2 * | 6/2011 | Kodani | H05K 3/205 29/852 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,318,452 B2 * | 4/2016 | Chen | H01L 21/4846 |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |

(Continued)

*Primary Examiner* — Luan C Thai
(74) *Attorney, Agent, or Firm* — WPAT, P.C., Intellectual Property Attorneys; Anthony King

(57) ABSTRACT

A semiconductor structure comprises: a substrate, an alignment mark, pillars, and a seal wall. The alignment mark is adjacent to a surface of the substrate. The pillars protrudes from the substrate. The seal wall protrudes from the surface of the substrate and surrounding the alignment mark. The seal wall is between the pillars and the alignment mark. The pillars is configured into at least two different groups with different average heights. The seal wall around the alignment mark can prevent the alignment mark from the coverage of the flux. Further, the seal wall can be formed with pillars at the same time, and the increased cost is limited.

20 Claims, 18 Drawing Sheets

(56) References Cited

U.S. PATENT DOCUMENTS

| | | |
|---|---|---|
| 9,685,411 B2 * | 6/2017 | Chen ............... H01L 23/544 |
| 9,735,129 B2 * | 8/2017 | Chen ............... H01L 24/19 |
| 2014/0252558 A1 * | 9/2014 | Yu ............... H01L 23/544 |
| | | 257/618 |

* cited by examiner

SEMICONDUCTOR STRUCTURE AND MANUFACTURING METHOD THEREOF

CROSS REFERENCE TO RELATED APPLICATIONS

This application claims the benefit of U.S. provisional application 62/582,498, filed on Nov. 7, 2017, which is incorporated by reference in its entirety.

BACKGROUND

The present disclosure relates generally to a semiconductor structure and more particularly relates to an in-situ sealing structure on an interposer.

Performance requirements such as increased bandwidth, reduced latency, and lower power are driving the adoption of 3D-IC designs, and thus silicon interposers. An interposer is an electrical interface to spread a connection to a wider pitch or to reroute a connection to a different connection. Silicon interposers are being used to stack chips side-by-side, allowing designers to put dies next to each other in a high-bandwidth and low-latency configuration. A common example of an interposer is an integrated circuit die to Ball Grid Array (BGA). This is done through various substrates, both rigid and flexible. While more pillars are required in the interposer, the dimension of the surface of the substrate of the interposer for arranging the pillars gets larger. Also, the patterns of the pillars get more complicated, and the heights of the pillars will vary because of the pattern densities of the arrangements of the pillars in different areas. The failed joints may happen between the lower pillars of the interposer and vias of a connected device while the heights of the pillars are different. To solve the failed joints, the flux may be required to be jetted on the pillars to facilitate coupling the pillars of the interposer with vias of the connected device. However, the jetted flux tends to creep onto the alignment mark and cause machine continuous recognition fail and lower down throughput.

Therefore, there is a requirement for the present disclosure concerning the process method for in-situ plating a seal wall around alignment mark to prevent from the coverage of the flux. This seal wall can be plated with pillars at the same time, and increase limited manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
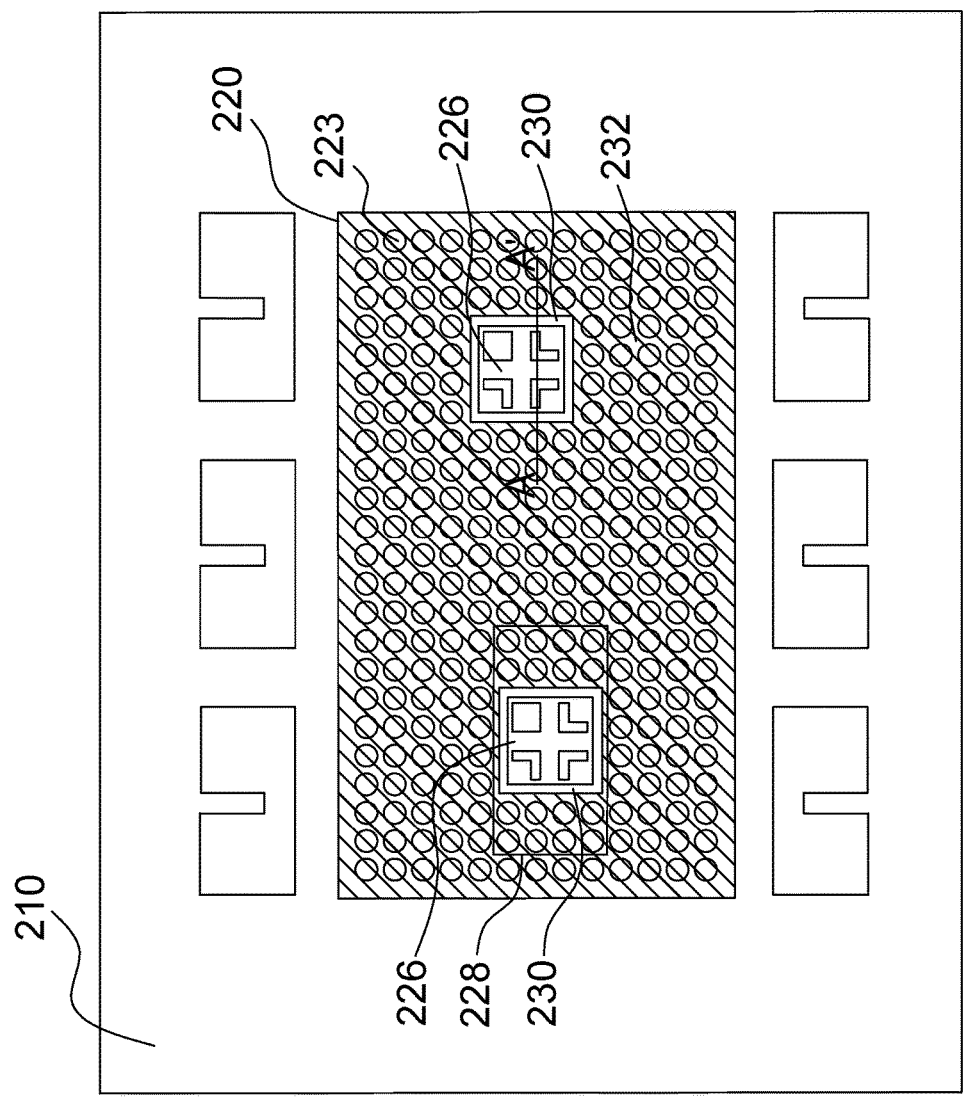
FIG. 1A is a top view illustrating a semiconductor structure in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with one embodiment of the present disclosure, FIG. 1A illustrates a top view of a semiconductor structure 200. The semiconductor structure 200 includes a substrate 210. Surface 220 indicates a region on the substrate 210. Some alignment marks 226 and pillars 223 are arranged in the surface 220. The pillars 223 are external connection bumps formed on the surface 220 of the substrate 210 to communicate the signals with the coupled device. The alignment mark 226 formed on the surface 220 of the substrate 210 has the position information relevant to the device to be coupled. Each alignment mark 226 may include several features to form a pattern, which can be recognized while performing alignment. To provide proper alignment while coupling the substrate 210 with other devices, photo-lithography tools can be equipped to locate the alignment mark 226. In the present embodiment, each alignment mark is designed with a same pattern, however, different patterns are also allowed for different alignment marks on a same substrate. In some embodiments, the alignment mark 226 may be a metal pattern, and the alignment mark 226 may be provided in the form of a recess in the surface 220 of the substrate 210. Further, the alignment mark 226 may be a color mark having a color different from the surface 220 of the substrate 210, and the alignment mark 226 may have a pattern identical to that of the pillars 223.

Pillar 223 is an external electric contact for the semiconductor structure 200. One end of the pillar can be designed to be electrically coupled to a conductive pad in the substrate 210 and the other end of the pillar can be configured to be electrically coupled to another substrate. The conductive pad may be further connected to a circuit embedded in the substrate 210, and thus the substrate 210 can be electrically communicated with other devices external to the semiconductor structure 200. In some embodiments, pillars are arranged in a pattern based on the conductive pad distribution in the substrate 210. In the present disclosure, the pillars 223 are arranged in an array in order to provide external contact for the conductive pad. In some embodiments, some of the pillars may be designed as floating without connecting/coupling to any current source.

Figure 1B:
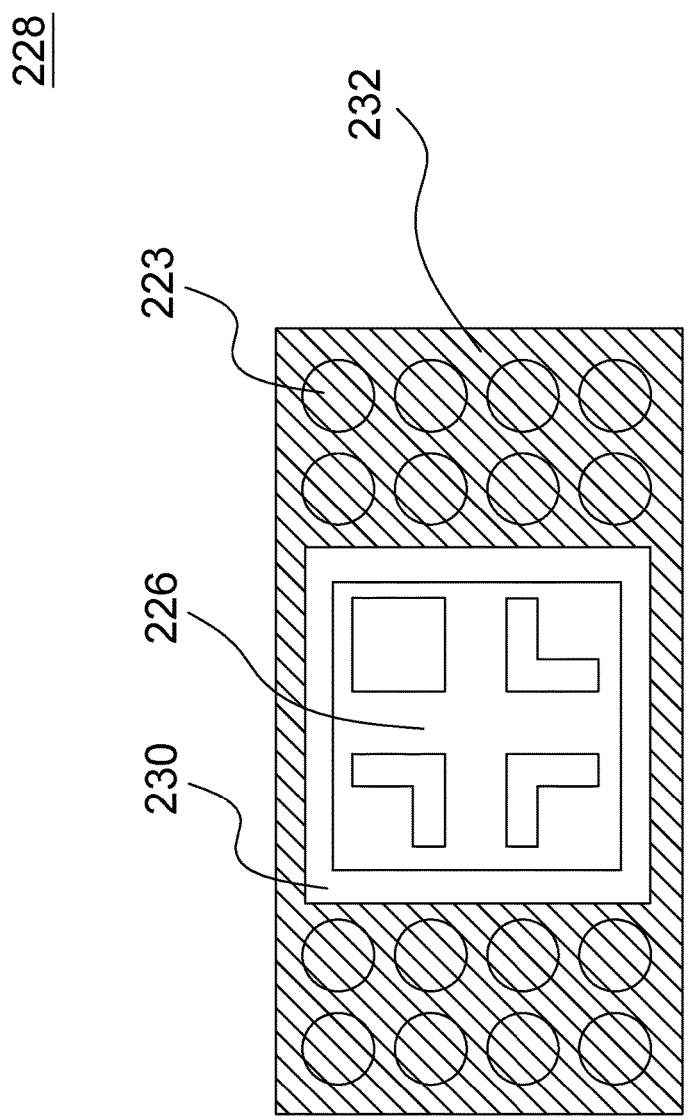
FIG. 1B is a top view illustrating an area of the semiconductor structure of FIG. 1A of the present disclosure.

FIG. 1B is a top view illustrating an area 228 of the semiconductor structure of FIG. 1A of the present disclosure. To facilitate the bonding between the pillars 223 and the devices connected the pillars 223, the flux 232 is usually required to be jetted to the surface 220 to cover the pillars 223 in the surface 220. In the present embodiment, each alignment mark 226 is surrounded by a seal wall 230 configured to seal the alignment mark 226 within a pillar-free area to prevent the alignment marks 226 from being covered by the flux 232. In other words, the alignment mark 226 is separated from the pillars 223 by the seal wall 230. In the embodiment of FIG. 1B, the top view of the wall 230 is a square with four equal straight sides and four right angles. However, the wall 230 can be formed rectangular, circle, or any other shape to adapt the pattern of the pillars. Further, the wall 230 can be either continuous or noncontinuous based on the requirement of the process.

Figure 1C:
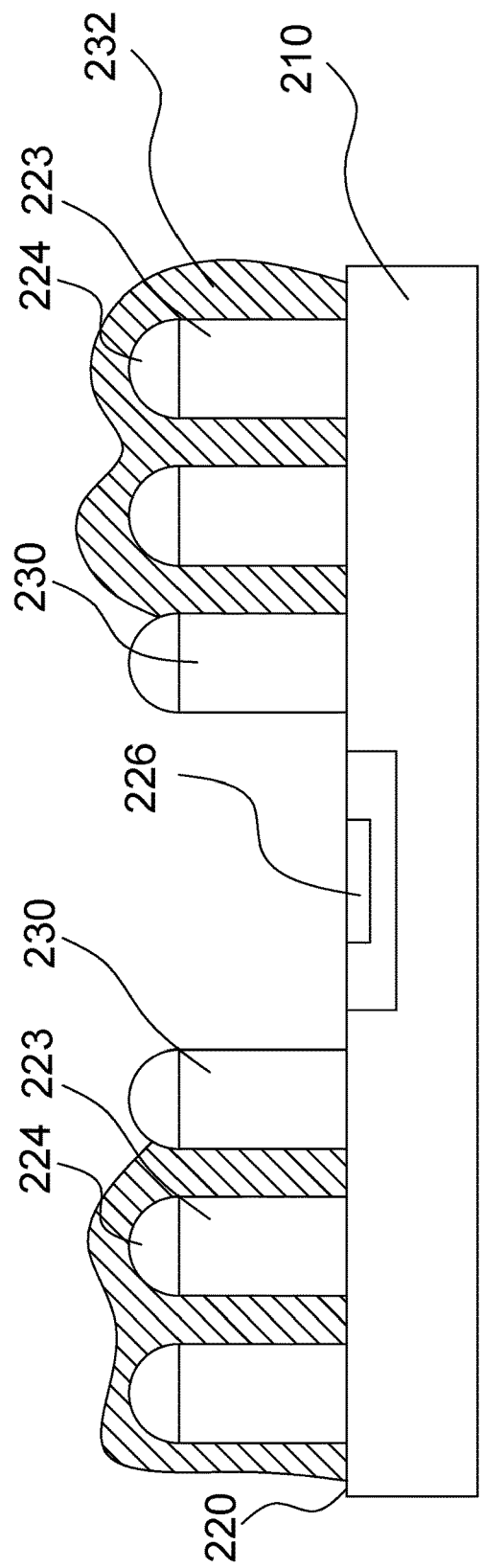
FIG. 1C is a cross-sectional view illustrating the semiconductor structure of FIG. 1A of the present disclosure.

FIG. 1C is a cross-sectional view illustrating the semiconductor structure along Line A-A' of FIG. 1A of the present disclosure. The pillars 223 and the seal wall 230 protrude from the surface 220 of the substrate 210, and solders 224 can be formed on top of the pillars 223. The solders 224 may also be formed on the seal wall 230 while being formed on top of the pillars 223. The goal in forming the solders 224 is to form a strong, reliable, and electrically and thermally conductive joint. Many methods are available to apply the solder in a variety of forms, one of which can be molten solder directly jetted onto wafer bumps, such as being printed directly onto pillars. Although FIG. 1C shows no layer formed on the alignment mark 226, but, in some embodiments, the layer formed on the alignment mark 226 can be transparent or translucent, allowing the alignment mark 226 on the substrate 210 to be optically detected by techniques, such as bright field or dark field alignment. In FIG. 1C, the alignment mark 226 is adjacent to the surface 220 of the substrate 210, and is embedded in the substrate 210. However, the alignment mark 226 can protrude from the surface 220 of the substrate 210 in some embodiments of the present disclosure.

Figure 2A:
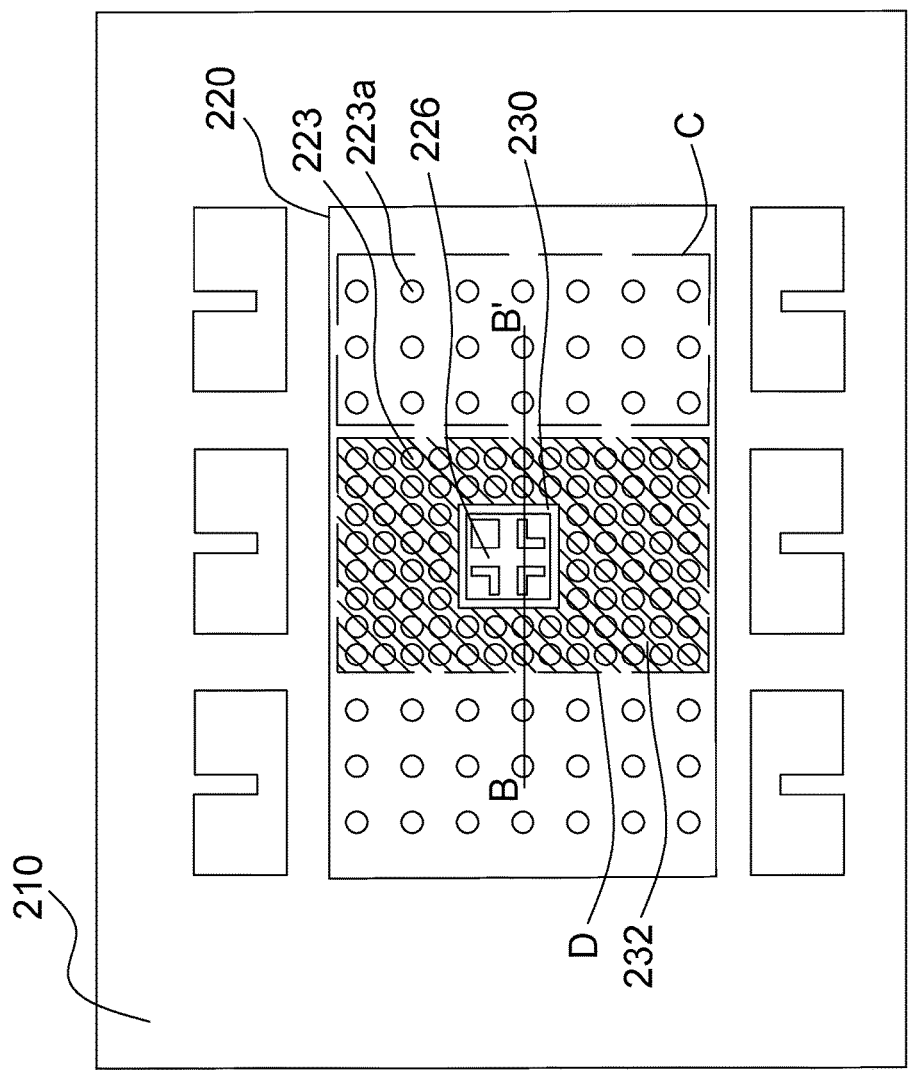
FIG. 2A is a top view illustrating a semiconductor structure in accordance with a further embodiment of the present disclosure.

FIG. 2A is a top view illustrating a semiconductor structure in accordance with a further embodiment of the present disclosure, and pillars 223, 223a of FIG. 2A are configured into two different groups C, D with different pattern densities to demonstrate the condition that the patterns of pillars 223, 223a will get more complicated while the dimension of the surface 220 of the substrate 210 gets larger.

Figure 2B:
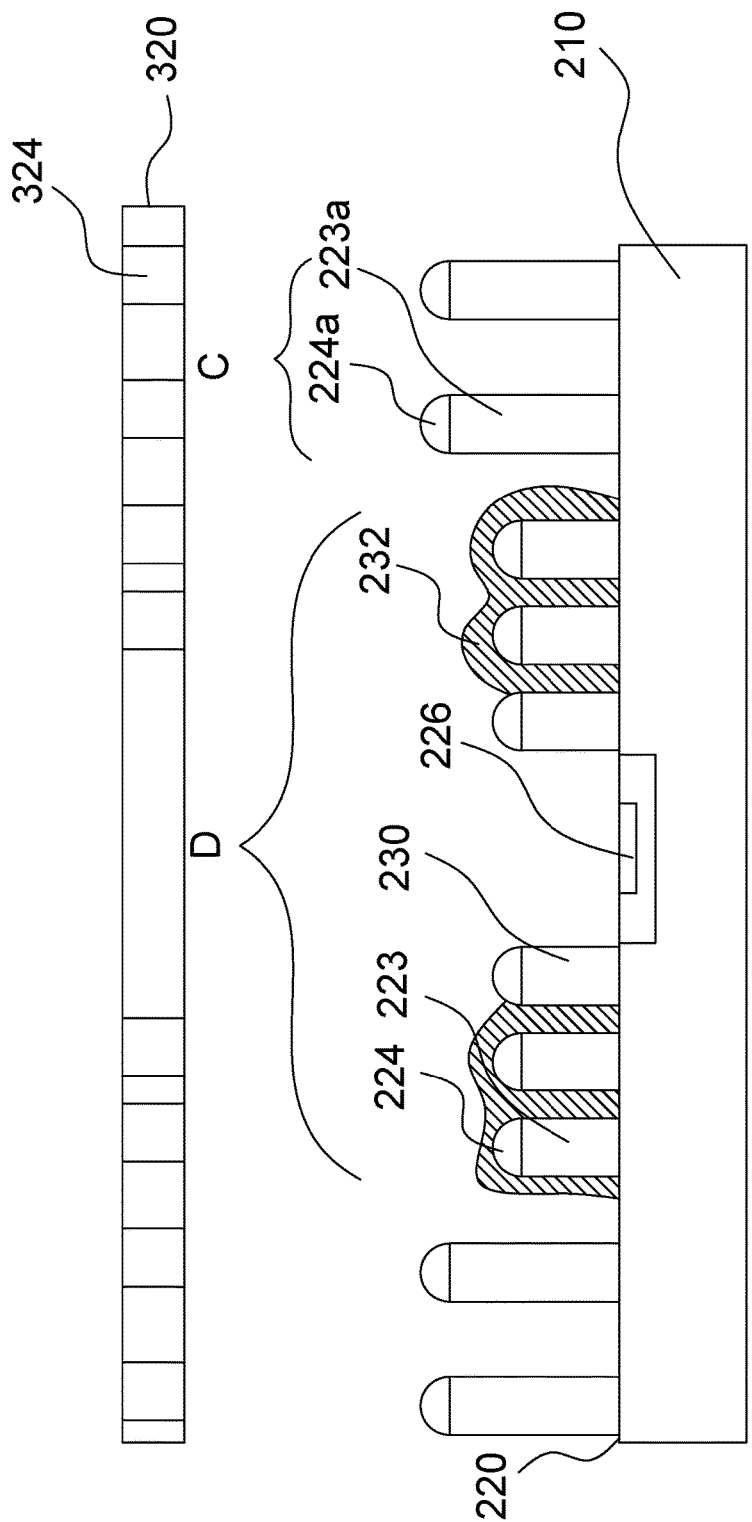
FIG. 2B is a cross-sectional view illustrating the semiconductor structure of FIG. 2A of the present disclosure.

Although heights of the pillars 223 are the same in FIG. 1C, the heights of the pillars 223 in other embodiments, for example, in FIG. 2B, may be different to each other. Basically, the height of the pillars 223 in an area is decided by the density of their arrangement. While the density of pillars 223 in an area is higher than that in another area, the height of pillars 223 in the area is shorter than that in another area. In other words, while the pillars 223 are arranged more crowded, the pillars 223 will be formed shorter. Return to FIG. 1A, the arrangement of the pillars 223 is even in the surface 220, and thus the densities everywhere of the surface 220 are the same. However, when the advanced technique is developed, the more pillars 223 are required in the surface 220, and the larger surface 220 of the substrate 210 for arranging the pillars 223 is required. For example, the dimension of the surface 220 of the substrate 210 in the present disclosure may be larger than or equivalent to 30 mm. When the dimension of the surface 220 of the substrate 210 gets larger, the densities of areas in the surface 220 of the substrate 210 tends to be different to each other.

FIG. 2B is a cross-sectional view illustrating the semiconductor structure along Line B-B' of FIG. 2A of the present disclosure. The heights of the pillars 223 in a pillar group D and the heights of the pillars 223a in a pillar group C are different while the pattern density of the pillar group D and the pattern density of the pillar group C are different. The pillar group D has a pattern density higher than that of the pillar group C, and thus the pillar group D is formed with an average height lower than that of the pillar group C. Since the difference between the height of the pillars 223 and that of the pillars 223a results in a gap between the lower pillars 223 and the device 320 to be coupled, to facilitate coupling the lower pillars 223 with vias 324 of devices 320, more flux 232 is required to be jetted on the group D of the lower pillars 223, and the seal wall 230 can prevent the alignment mark 226 from being covered by the flux 232. Based on a preferred embodiment of the present disclosure, a pattern density of the pillar group D is 1~20% more than a pattern density of the pillar group C. Alternatively, the average height of the pillar group D may be 1~20% shorter than the average height of the pillar group C.

Referring to FIG. 2B, to couple the substrate 210 with other device, a nozzle may be used to aim at and jet flux to the pillar group D since the height of the group D is shorter than that of the group C. As technologies demand more efficient, high-volume production operations, sustainable throughput and consistent quality are critical factors for success, the jetting path of the nozzle can be programmed based on the patterns on the surface 220 to achieve the efficient application of flux in precise, thin patterns maximizes throughput and quality.

Figure 2C:
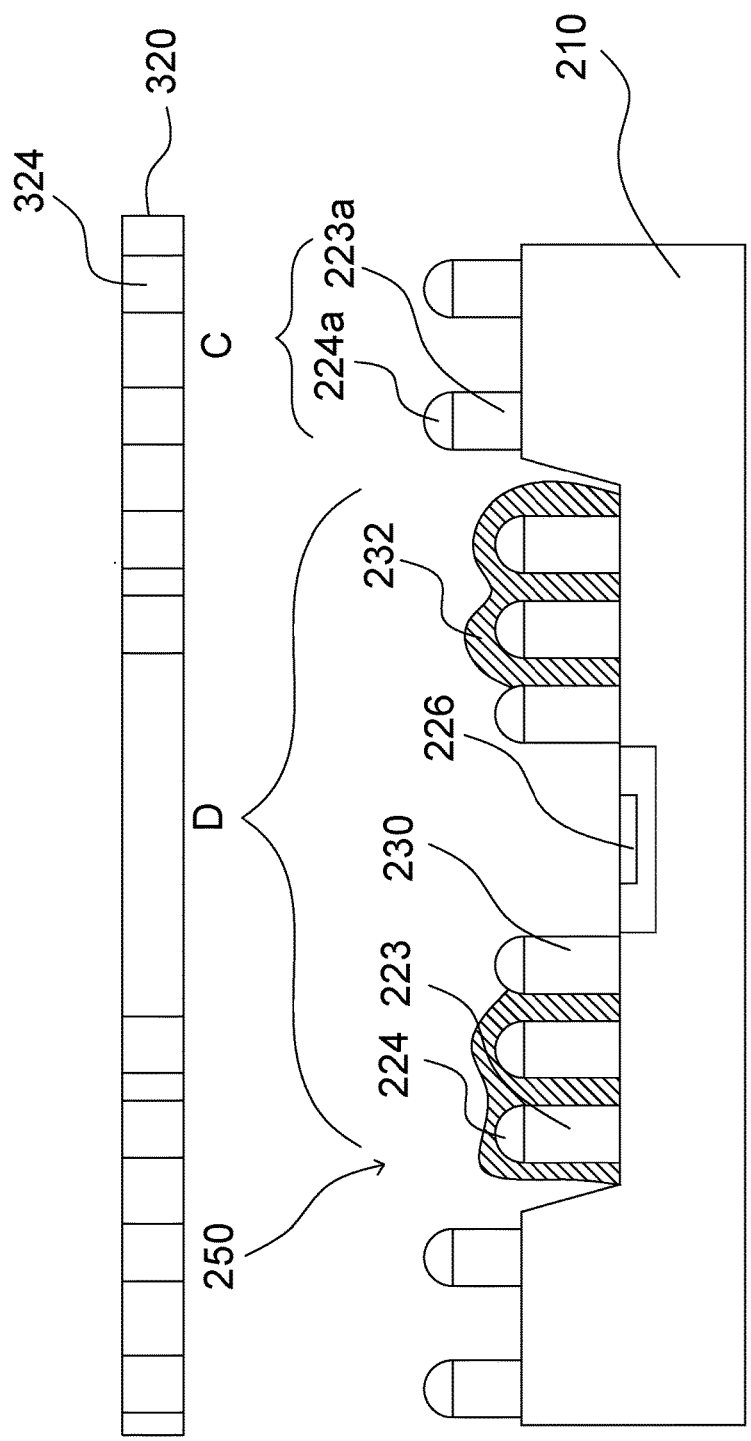
FIG. 2C is a cross-sectional view illustrating the semiconductor structure of another embodiment of the present disclosure.

FIG. 2C is a cross-sectional view illustrating the semiconductor structure of another embodiment of the present disclosure. The heights of the pillar group D and the heights of the group C of the pillars 223a are different while the pillar group D are in a cavity 250 of the substrate 210 and the pillar group D is in a position lower than that of the pillar group C. Since the pillar group D is in a position lower than that of the pillar group C, the difference between the height of the pillars 223 and that of the pillars 223a results in a gap between the lower pillars 223 and the device 320 to be coupled, to facilitate coupling the lower pillars 223 with vias 324 of devices 320, more flux 232 may be required to be jetted on the group D of the lower pillars 223, and the seal wall 230 can prevent the alignment mark 226 from being covered by the flux 232.

Still referring to FIG. 2C, to couple the substrate 210 with other device, a nozzle may be used to aim at and jet flux to the pillar group D since the height of the group D is shorter than that of the group C. As the use of too much flux, the presence of flux residue and/or the inconsistent application of flux can degrade the ability to solder the pillars and the connected devices, using appropriate flux-jetting techniques can improve the ability to control the consistency of flux application while also expanding the robustness and flexibility of the fluxing process. Therefore, the jetting path of the nozzle can be programmed based on the patterns on the surface 220 to achieve the efficient application of flux in precise, thin patterns and maximize throughput and quality.

Figure 3A:
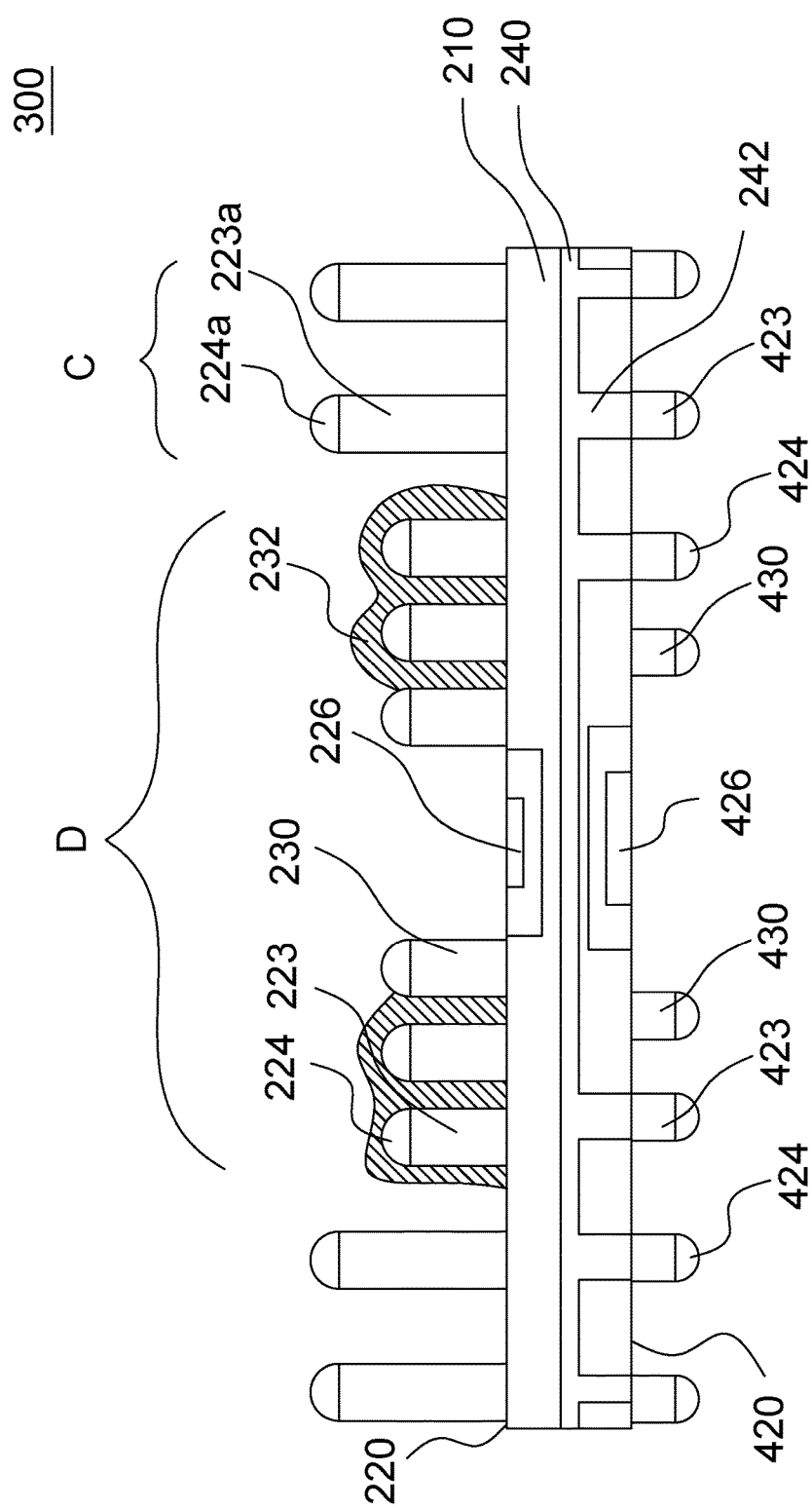
FIG. 3A is a cross-sectional view illustrating an interposer with pillars in two surfaces in accordance with another embodiment of the present disclosure.

FIG. 3A is a cross-sectional view illustrating an interposer 300 with pillars 223, 223a, 424 in two surfaces 220, 420 in accordance with another embodiment of the present disclosure. FIG. 3A shows that a second alignment mark 426 is adjacent to a second surface opposite to the surface which the pillars 223 protruding from. Pillars 423 and a second seal wall 430 protrude from the second surface 420 of the substrate 210. Solders 424 are formed on the top of the pillars 423. Similar to the seal wall 230, the second alignment mark 426 is surrounded by the second seal wall 430 configured to seal the second alignment mark 426 within a pillar-free area to prevent the second alignment mark 426 from being covered by the flux 232. In other words, the second seal wall 430 is between the pillars 423 and the second alignment mark 426.

The interposer 300 is an electrical interface to spread a connection to a wider pitch or to reroute a connection to a different connection, and can be used for integrating many devices into a stacking. Since devices are variable, the pattern of the pillars 223, 223a of the interposer corresponding to vias of these devices are irregular, and thus the average heights of the pillar group D and the pillar group C are different. the difference between the height of the pillars 223 and that of the pillars 223a results in a gap between the lower pillars 223 and the device 320 to be coupled, to facilitate coupling the lower pillars 223 with vias 324 of devices 320, more flux 232 may be required to be jetted on the group D of the lower pillars 223, and the seal wall 230 can prevent the alignment mark 226 from being covered by the flux 232.

Figure 3B:
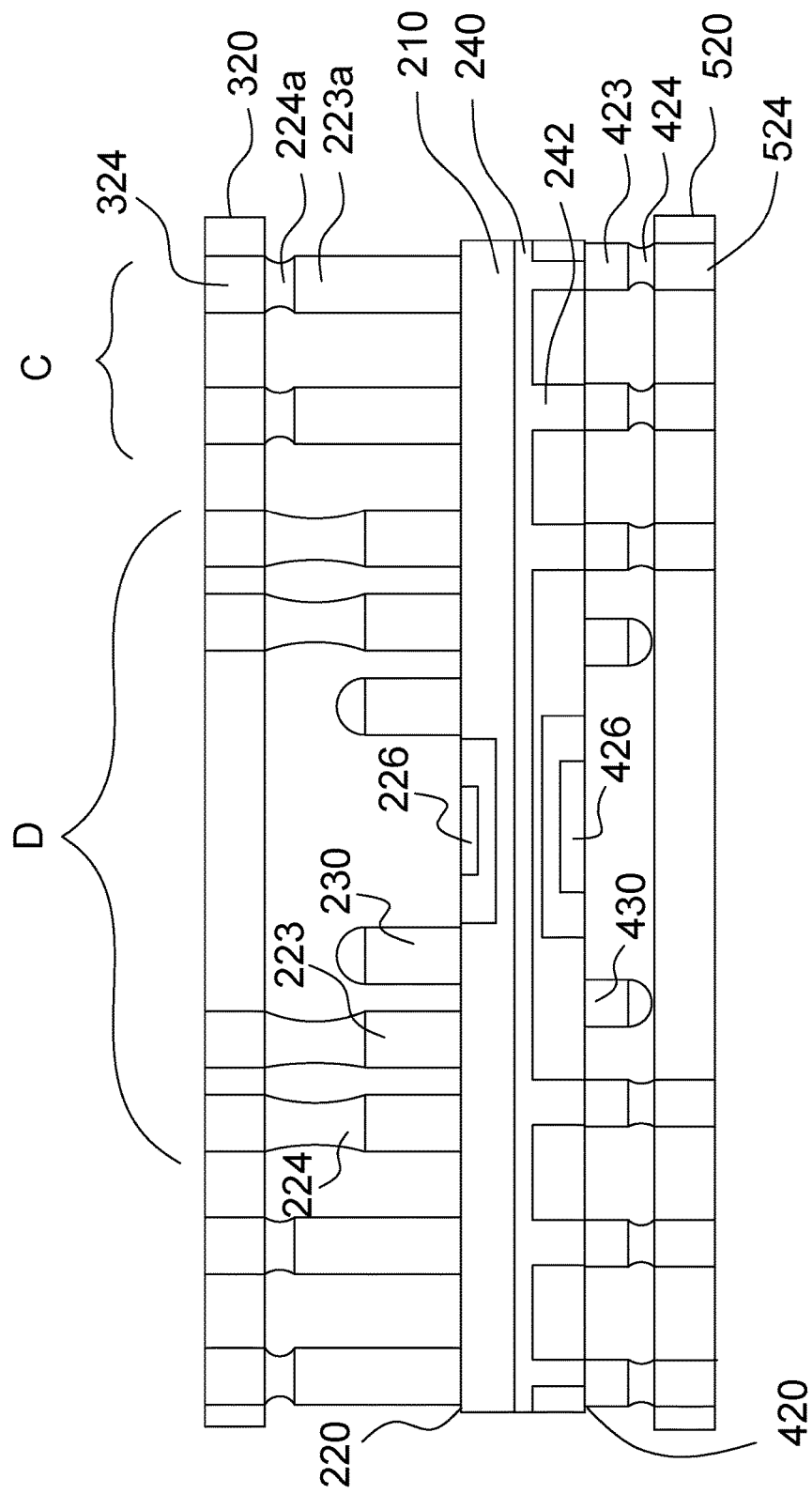
FIG. 3B is a cross-sectional view illustrating the interposer of FIG. 3A coupling with two devices in two surfaces in accordance with another embodiment of the present disclosure.

FIG. 3B is a cross-sectional view illustrating the interposer 300 of FIG. 3A coupling with two devices 320, 520 in two surfaces 220, 420 in accordance with another embodiment of the present disclosure. The devices 320, 520 can be chips or dies, but, alternatively, can be replaced by a printed circuit board (PCB) or a ball grid array (BGA). After the bonding process, the solders 224, 224a are melt and then solidified to connect the vias 324 of a device 320 with the pillars 223, and the solders 424 are melt and then solidified to connect the vias 524 of a device 520 with the pillars 423.

The interposer 300 can be a silicon interposer, and can be used to stack chips side-by-side to put dies next to each other in a high-bandwidth and low-latency configuration. Another embodiment of the interposer 300 is an integrated circuit die to Ball Grid Array (BGA). In some embodiments of the present disclosure, the interposer 300 can be the electrical interface between devices and a substrate, rigid or flexible.

While more pillars are required in the interposer 300, the dimension of the surface of the substrate 210 of the interposer 300 for arranging the pillars gets larger. Also, the patterns of the pillars 223, 223a get more complicated, and the heights of the pillars 223, 223a will vary because of the pattern densities of the arrangements of the pillars 223, 223a in different areas, such as areas of the pillar groups C and D.

The failed joints may happen between the lower pillars 223 of the interposer and vias of a connected device 320 while the heights of the pillars 223, 223a are different. To solve the failed joints, more flux may be required to be jetted on the pillars 223 to facilitate coupling the pillars 223 of the interposer 300 with vias 324 of the connected device 320. However, although the jetted flux is not tracable in a final product of the interposer 300, the flux tends to creep onto the alignment mark 226 and cause machine continuous recognition fail and lower down throughput before the flux vanishes. Thus, the overflow of the flux may affect the alignment process, and the seal wall 230 can prevent the alignment mark 226 from being covered by the flux, and keeps the throughput without the machine continuous recognition fail.

Figure 4A:
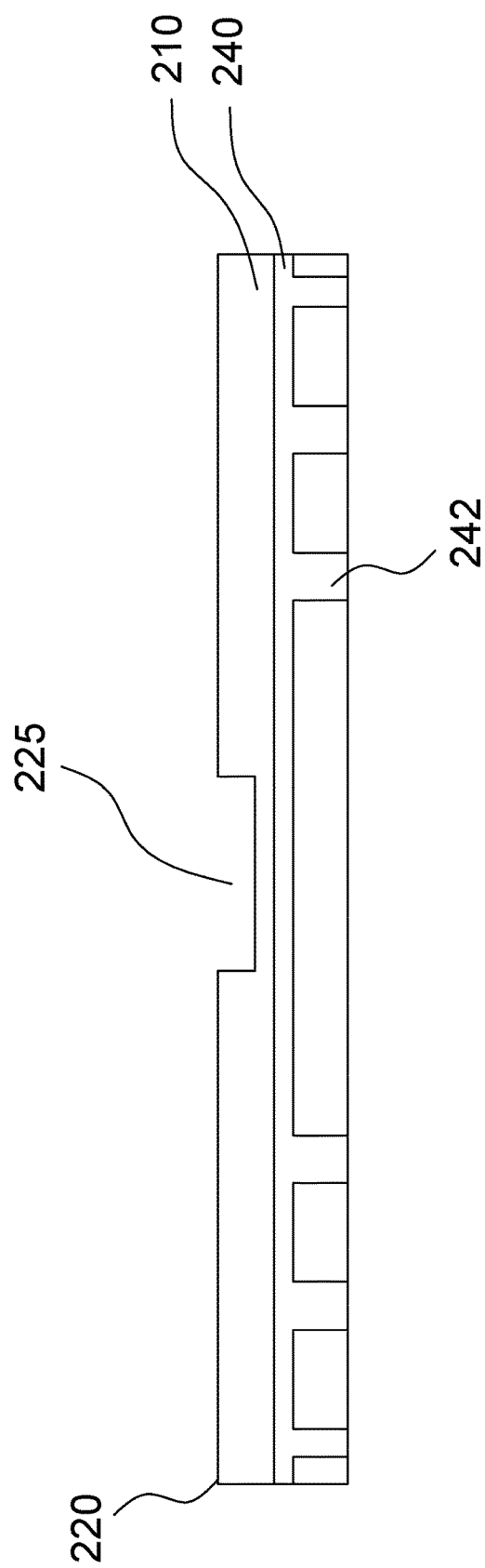
FIGS. 4A-4E are cross-sectional view illustrating operations of forming the semiconductor structure of FIG. 2B of the present disclosure.

FIGS. 4A-4E are cross-sectional view illustrating operations of forming the semiconductor structure 200 along Line B-B' of FIG. 2A of the present disclosure. FIG. 4A shows that an indentation 225 is formed in the substrate 210. The substrate 210 may comprises a redistribution layer (RDL) 240 and one or more through-silicon vias (TSV) 242 directly or indirectly connected to the redistribution layer (RDL) 240.

Figure 4B:
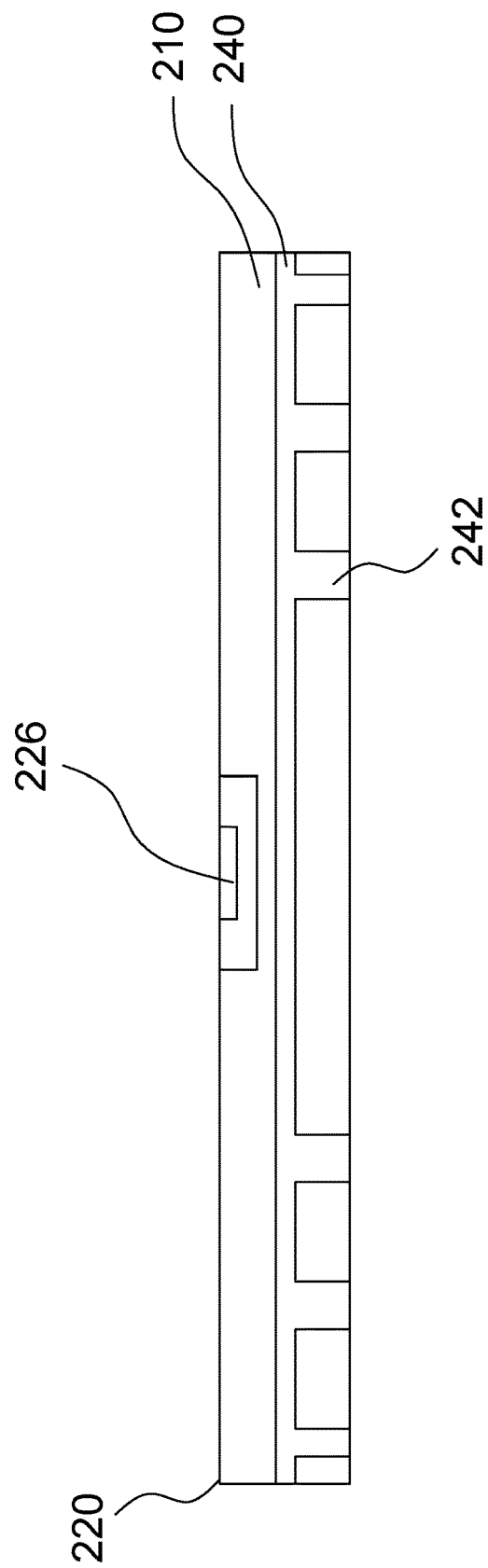

Referring to FIG. 4B, an alignment mark 226 is formed adjacent to the surface 220 of the substrate 210. FIG. 4B shows that the alignment mark 226 is formed embedded in the substrate 210, but the alignment mark 226 may protrude from the surface 220 of the substrate 210 in other embodiments.

Figure 4C:
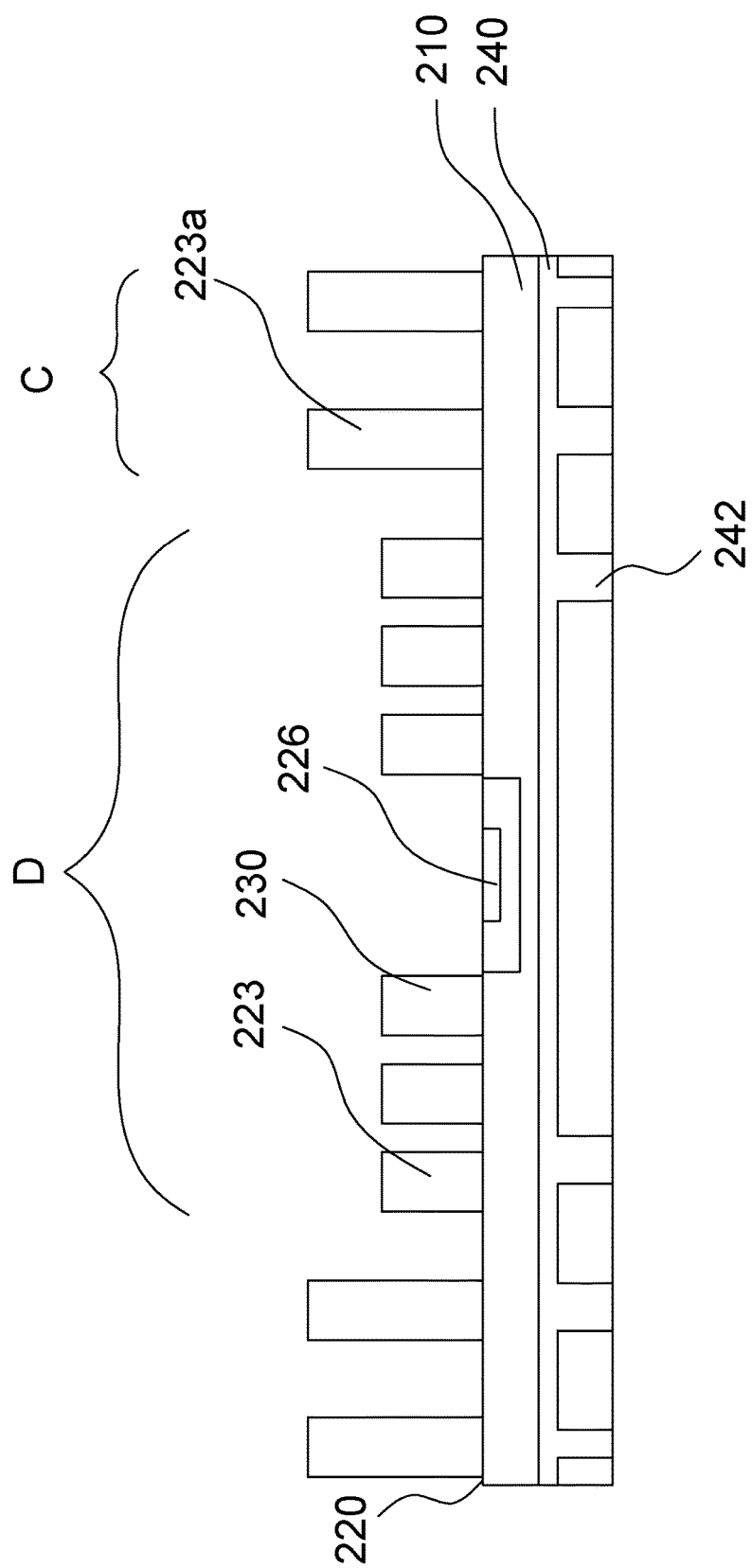

Referring to FIG. 4C, a seal wall 230 is formed surrounding the alignment mark 226 in the substrate 210, and the pillars 223 may be formed by plating outside the seal wall 230. Optionally, the seal wall 230 may be formed by in-situ plating together with the pillars 223 in the substrate 210. The cost to add the seal wall 230 in the substrate 210 is limited if the seal wall 230 is formed together with the pillars 223. Although the alignment mark 226 is formed before the seal wall 230 in the embodiment shown in FIG. 4C, the alignment mark 226 can be formed after the seal wall 230 in other embodiments. By referring to FIG. 2A, the pillar group D has a pattern density higher than that of the pillar group C, and thus the pillar group D is formed with an average height lower than that of the pillar group C.

Figure 4D:
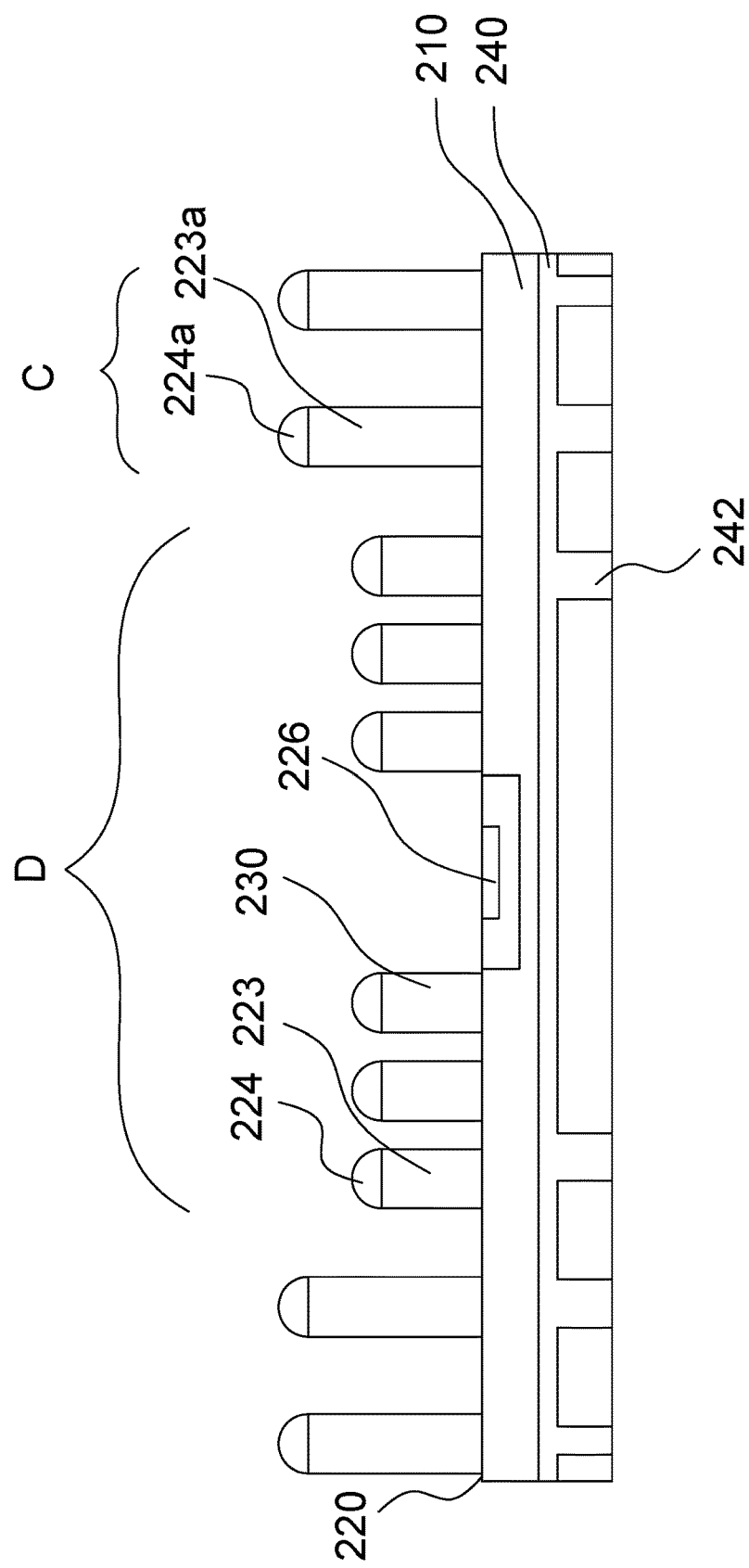

Referring to FIG. 4D, solders 224 are formed on the pillars 223 and the seal wall 230. Solders 224 are electrically or thermally conductive joint with the coupled devices (not shown) and can be applied in a variety of forms, such as molten solder directly jetted onto wafer bumps, such as being printed directly onto pillars 223. The pillars 223, 223a are directly or indirectly connected to the redistribution layer (RDL) 240. Since the through-silicon vias (TSV) 242 are also directly or indirectly connected to the redistribution layer (RDL) 240. The pillars 223, 223a can electrically communicate with the through-silicon vias (TSV) 242.

Figure 4E:
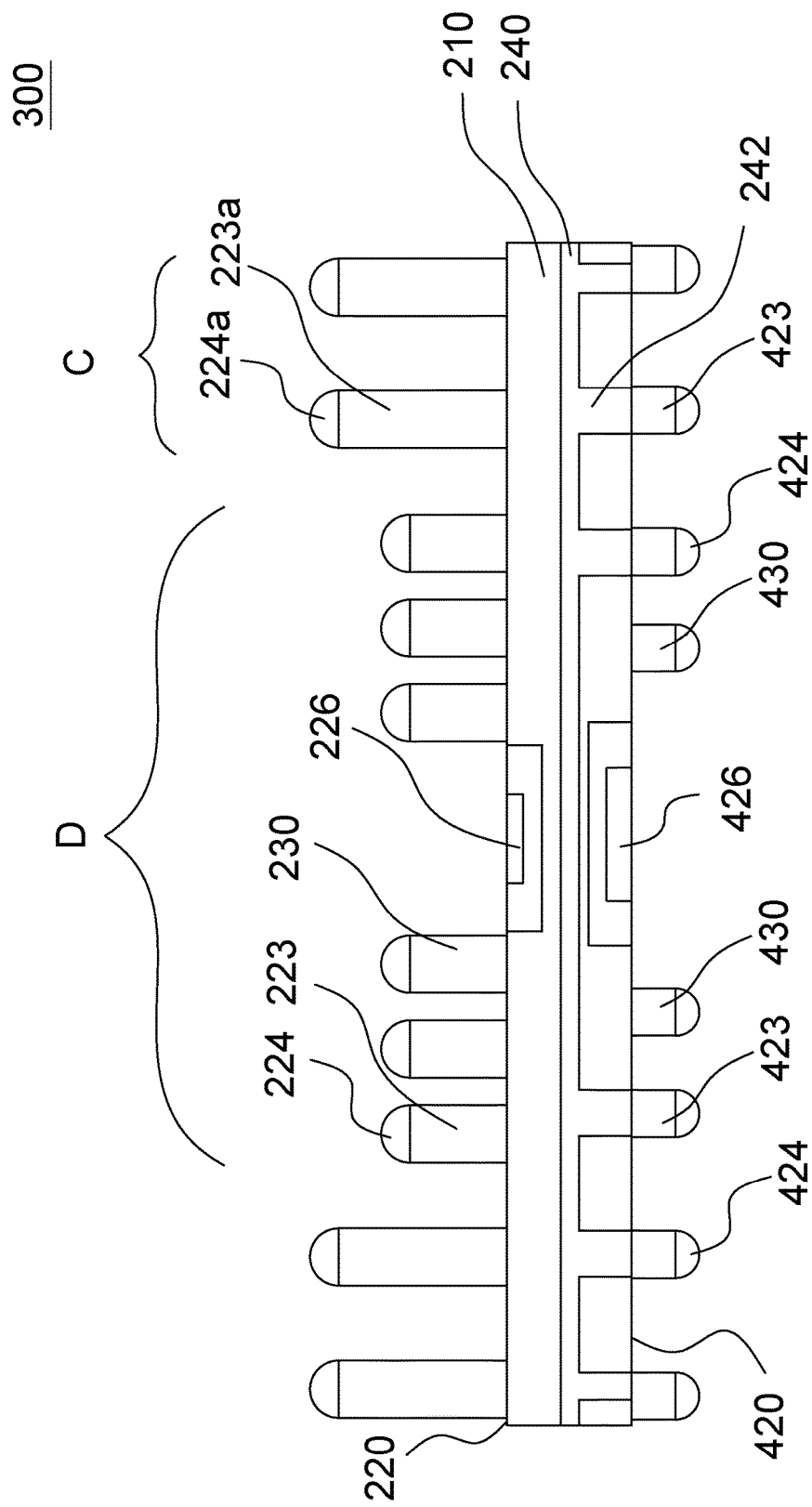

Referring to FIG. 4E, an interposer 300 is formed after the operation of forming the semiconductor structure shown in FIG. 4D. The bottoms of the through-silicon vias (TSV) 242 are connect to pillars 423 in the surface 420 of the back side. A seal wall 430, an alignment mark 426, and pillars 423 may be formed in the back side by repeating the operations illustrated in FIGS. 4A-4D. In other words, after forming the seal wall 230, the alignment mark 226, and the pillars 223, 223a in the surface 220 of the front side of the substrate 210, the alignment mark 426 is formed on a back side of the substrate 210 opposite to the surface 220 of the front side of the substrate 210. Then, the pillars 423 are formed on the surface 420 of the back side of the substrate 210 by plating process. In some embodiments, a seal wall 430 is formed surrounding the alignment mark 426 on the back side of the substrate 210 when the pillars 423 is formed. The seal wall 430 is formed between the pillars 423 and the alignment mark 426. After the seal wall 430 and the pillars 423 are formed, solders 424 is formed on the pillars 423. Finally, the interposer 300 is finished, and flux can be jetted to the pillars 423 to facilitate the coupling with another device. Returning to FIG. 3B, the device 520 with vias 524 is provided to connect to the pillars 423 through the solders 424 of the interposer 300.

Figure 5A:
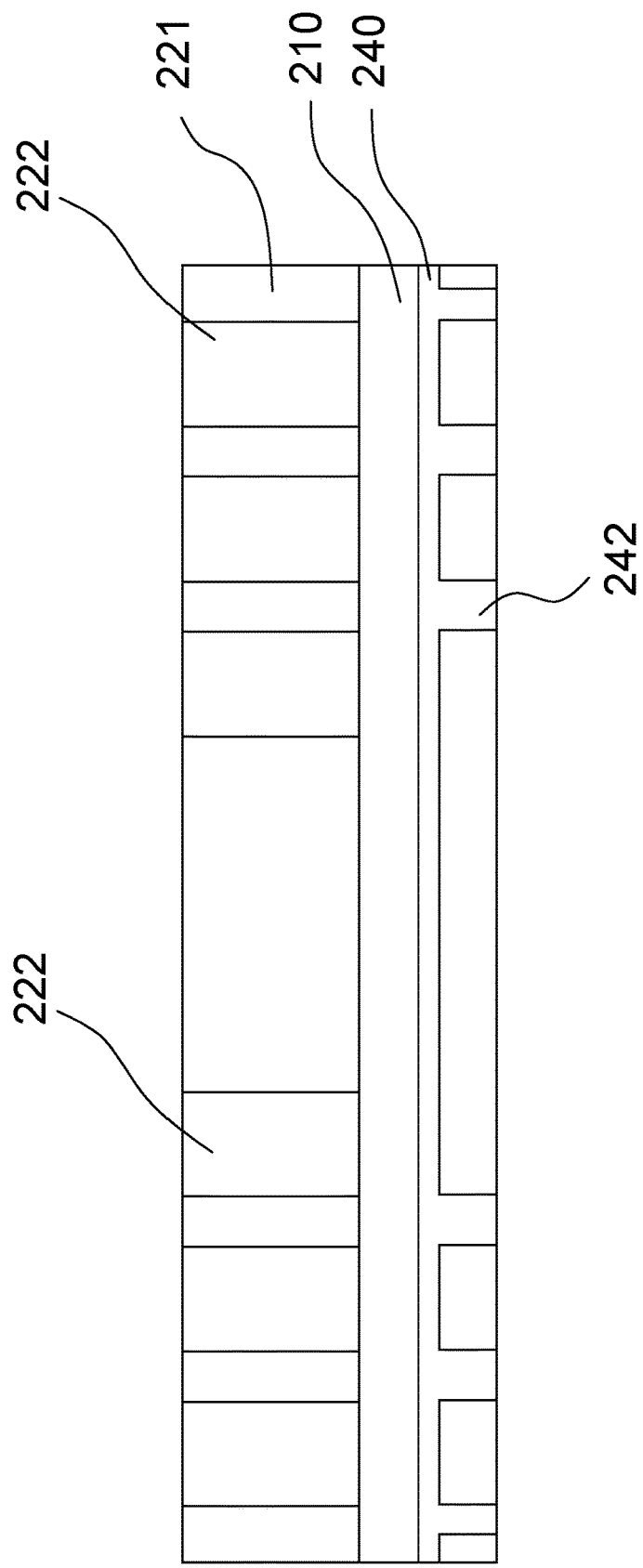
FIGS. 5A-5E are cross-sectional view illustrating operations of forming the semiconductor structure of another embodiment of the present disclosure.

FIGS. 5A-5E are cross-sectional view illustrating operations of forming the semiconductor structure of another embodiment of the present disclosure. While the seal wall 230 and the pillars 223, 223a are formed by plating in the operations of FIGS. 4A-4E, FIGS. 5A-5D illustrates the operations to form the seal wall 230b and the pillars 223b by nailing process. FIG. 5A illustrates a dielectric layer 221 and vias 222 formed inside the dielectric layer 221. The vias 222 can be the through silicon vias (TSV).

Figure 5B:
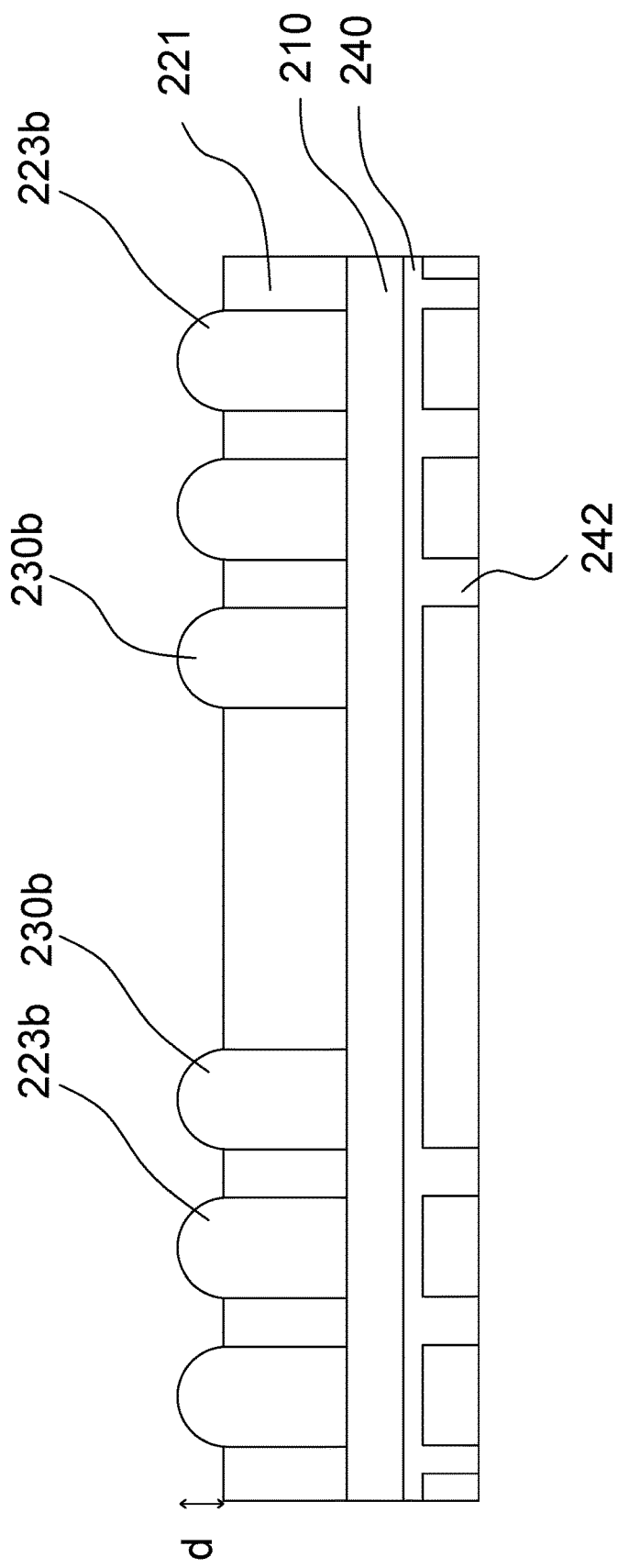

FIG. 5B illustrates that a depth d of the dielectric layer 221 are removed, and the top ends of the vias 222 are exposed from the dielectric layer 221 to form a seal wall 230b and the pillars 223b. Therefore, the seal wall 230b can be formed together with the pillars 223 in the substrate 210. The cost to add the seal wall 230 in the substrate 210 is limited if the seal wall 230 is formed together with the pillars 223. The top end of the vias 222 can be exposed by the etching process or the chemical-mechanical planarization (CMP).

Figure 5C:
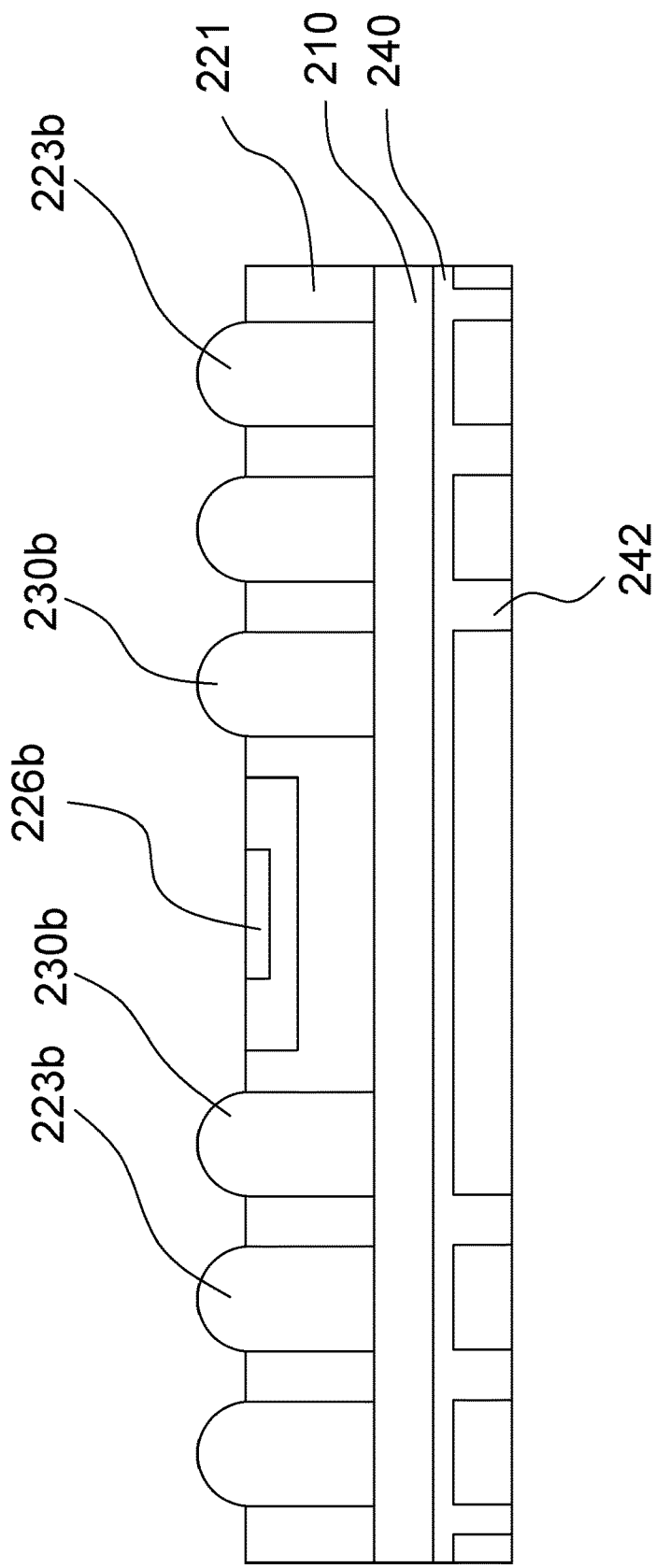

FIG. 5C shows that the alignment mark 226b is formed in the dielectric layer 221 over the substrate 210, but the alignment mark 226b may be formed protruding from the dielectric layer 221 of the substrate 210 in other embodiments. The alignment mark 226b is formed being surrounded by the seal wall 230b. Although the alignment mark 226b is formed after the seal wall 230b in the embodiment shown in FIG. 5C, the alignment mark 226b can be formed before the seal wall 230b in other embodiments. Similarly, to meet some requirements, the pillars 223b may be formed with different heights, and solders (not shown) may be formed on the pillars 223b and the seal wall 230b. Solders are electrically or thermally conductive joint with the coupled devices (not shown) and can be applied in a variety of forms, such as molten solder directly jetted onto wafer bumps, such as being printed directly onto pillars 223b.

Figure 5D:
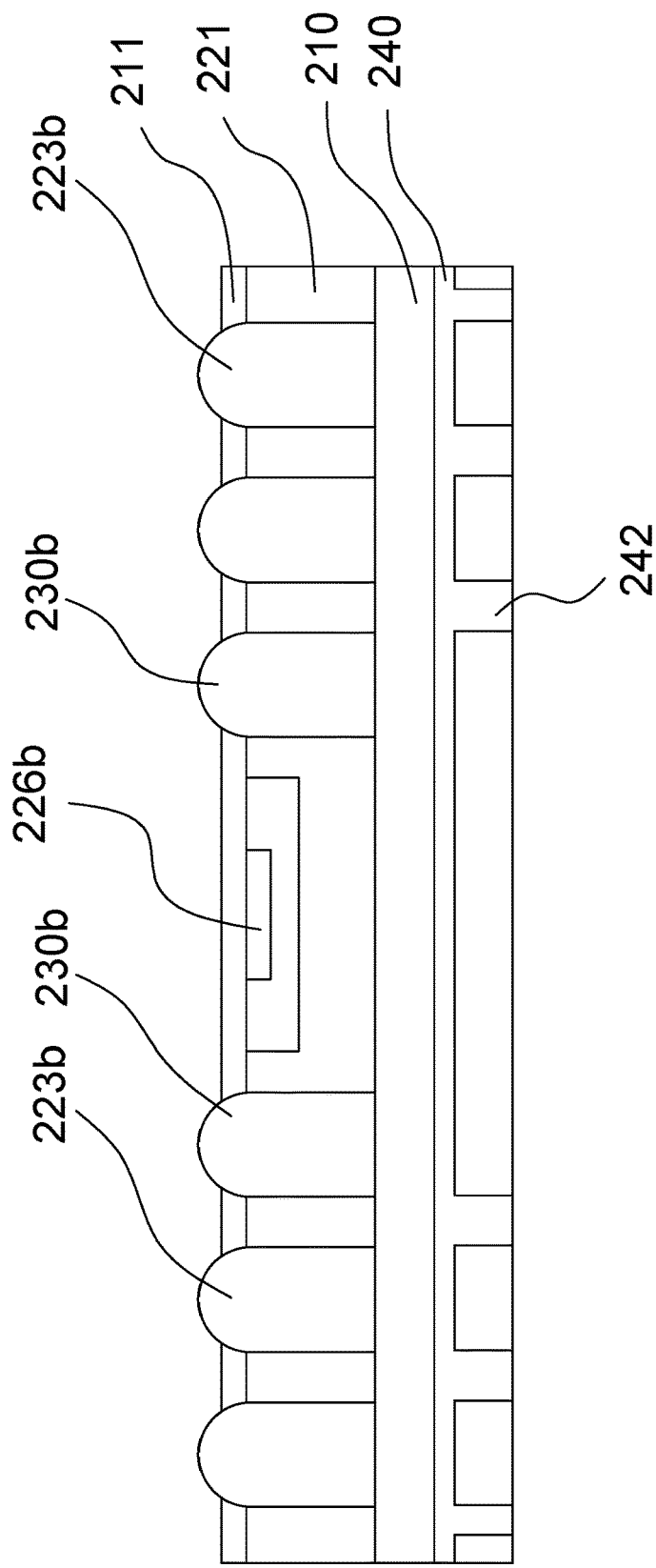

FIG. 5D shows that a protective layer 211 is formed on the dielectric layer 221 without covering the top ends of the pillars 223b. The protective layer 211 is transparent or translucent, and thus will not interfere with optical detection to keep throughput without causing machine continuous recognition fail. FIG. 5D illustrates that the pillars 223b are directly or indirectly connected to the redistribution layer (RDL) 240. Since the through-silicon vias (TSV) 242 are also directly or indirectly connected to the redistribution layer (RDL) 240. The pillars 223b can electrically communicate with the through-silicon vias (TSV) 242.

Figure 5E:
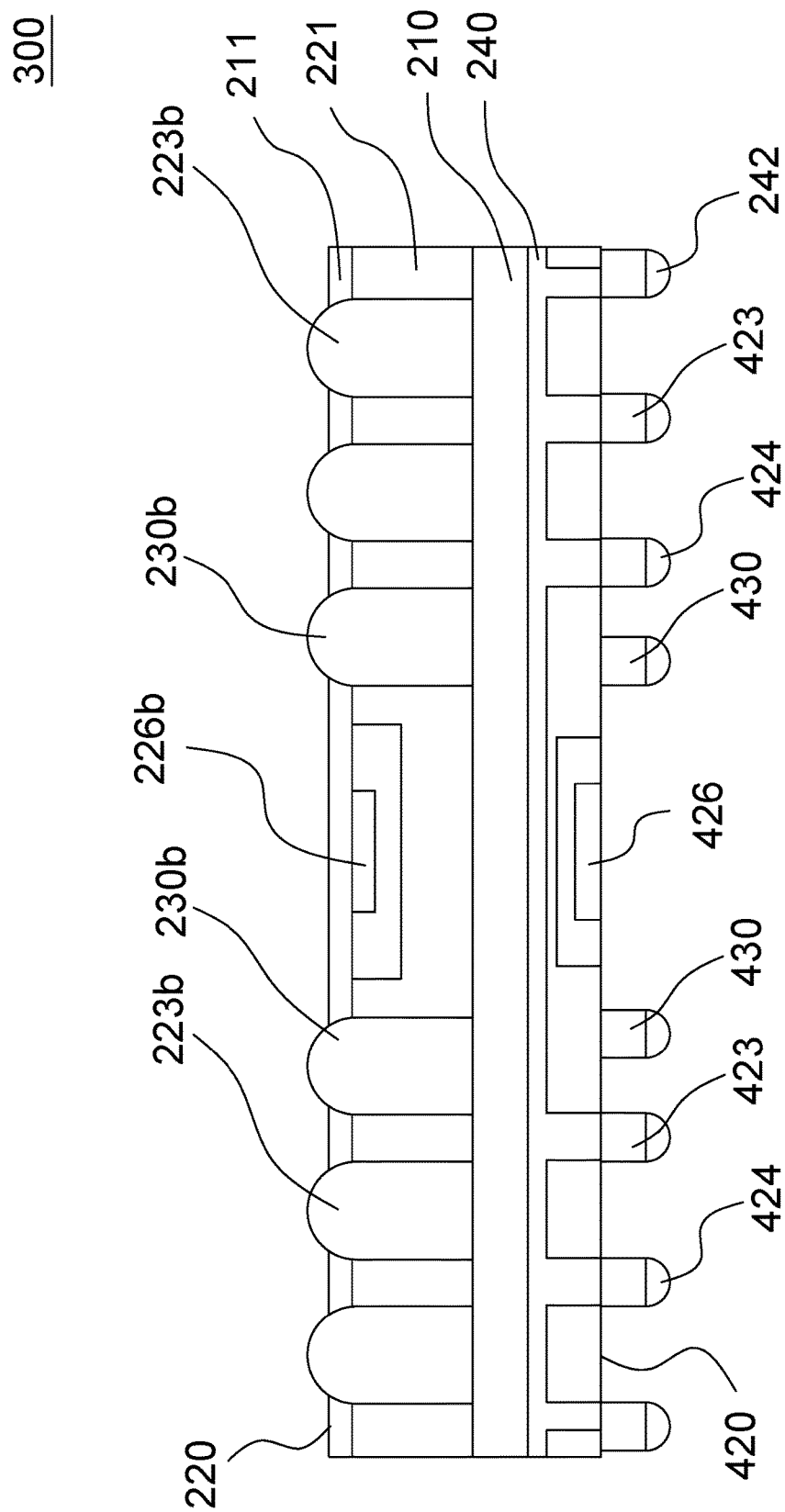

Referring to FIG. 5E, an interposer 300 is formed after the operation of forming the semiconductor structure shown in FIG. 5D. The bottoms of the through-silicon vias (TSV) 242 are connect to pillars 423 in the surface 420 of the back side. A seal wall 430, the alignment mark 426, and the pillars 423 may be formed in the back side by repeating the operations illustrated in FIGS. 4A-4D. In other words, after forming the seal wall 230, the alignment mark 226, and the pillars 223, 223a in the surface 220 of the front side of the substrate 210, the alignment mark 426 is formed on a back side of the substrate 210 opposite to the surface 220 of the front side of the substrate 210. Then, the pillars 423 are formed on the surface 420 of the back side of the substrate 210 by plating process. In some embodiments, the seal wall 430 is formed to surround the alignment mark 426 on the back side of the substrate 210 when the pillars 423 is formed. The seal wall 430 is formed between the pillars 423 and the alignment mark 426. After the seal wall 430 and the pillars 423 are formed, some other solders 424 are formed on the pillars 423. Finally, the interposer 300 is finished, and flux can be jetted to the pillars 423 to facilitate the coupling with another device. Returning to FIG. 3B, the device 520 shown in FIG. 3B with some other vias 524 are provided to connect to the pillars 423 through the solders 424 of the interposer 300.

The present disclosure provides the seal wall around the alignment mark to prevent the alignment mark from the coverage of the flux and avoid the machine continuous recognition fail. The seal wall can be formed with pillars at the same time, and the increased cost is limited.

The present disclosure provides a semiconductor structure. The semiconductor structure includes a substrate and an alignment mark. The alignment mark is adjacent to a surface of the substrate. Pillars protrude from the substrate, and a seal wall protrudes from the surface of the substrate and surrounds the alignment mark. The seal wall is between the pillars and the alignment mark, and the pillars are configured into at least two different groups with different average heights from each other.

The present disclosure provides a semiconductor structure. The semiconductor structure includes a substrate and an alignment mark in the substrate. A seal wall protrudes from the substrate and surrounds the alignment mark; and pillars protrude from the substrate. The seal wall is between the pillars and the alignment mark, and the pillars are configured into at least two different groups with different pattern densities from each other.

The present disclosure provides a method for forming a semiconductor structure. The method includes forming an alignment mark in the substrate, and then forming a seal wall to surround the alignment mark in the substrate. Further, pillars are formed outside the seal wall in the substrate, and solders are formed on the pillars. A pillar group is formed to have an average height lower from that of another pillar group. The method jets flux to the pillar group by aiming a nozzle at the pillar group to facilitate coupling the pillar group with vias of the connected device through the solders.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
   a substrate;
   an alignment mark adjacent to a surface of the substrate;
   a plurality of pillars protruding from the substrate; and
   a seal wall protruding from the surface of the substrate and surrounding the alignment mark, wherein the seal wall is between the plurality of pillars and the align- ment mark, and the plurality of pillars are configured into at least two different groups wherein a group has an average height different from an average height of an another group.

2. The semiconductor structure of claim 1, wherein the average height of the group of the plurality of pillars is 1~20% shorter than the average height of the another group of the plurality of pillars.

3. The semiconductor structure of claim 1, wherein a pattern density of the group of the plurality of pillars is 1~20% more than a pattern density of the another group of the plurality of pillars.

4. The semiconductor structure of claim 1, wherein a dimension of the surface of the substrate is larger than or equivalent to 30 mm.

5. The semiconductor structure of claim 1, further comprising:
    solders on the plurality of pillars; and
    a device connecting to the plurality of pillars through the solders.

6. The semiconductor structure of claim 1, further comprising:
    a second alignment mark adjacent to a second surface of the substrate, wherein the second surface is opposite to the surface which the plurality of pillars protruding from;
    a plurality of second pillars protruding from the second surface of the substrate; and
    a second seal wall protruding from the second surface of the substrate and surrounding the second alignment mark, wherein the second seal wall is between the plurality of second pillars and the second alignment mark;
    a plurality of second solders on the plurality of second pillars; and
    a second device connecting to the plurality of second pillars through the plurality of second solders.

7. A semiconductor structure, comprising:
    a substrate;
    an alignment mark in the substrate;
    a seal wall protruding from the substrate and surrounding the alignment mark; and
    a plurality of pillars protruding from the substrate, wherein the seal wall is between the plurality of pillars and the alignment mark, and the plurality of pillars are configured into at least two different groups wherein a group of the plurality of pillars has a pattern density different from a pattern density of an another group of the plurality of pillars.

8. The semiconductor structure of claim 7, wherein the pattern density of the group of the plurality of pillars is 1~20% more than the pattern density of the another group of the plurality of pillars.

9. The semiconductor structure of claim 7, wherein a average height of the group of the plurality of pillars is 1~20% shorter than a average height of the another group of the plurality of pillars.

10. The semiconductor structure of claim 7, wherein the substrate is larger than or equivalent to 30 mm and the alignment mark is embedded in the substrate.

11. The semiconductor structure of claim 7, further comprising:
    solders on the plurality of pillars; and
    a device with vias connecting to the plurality of pillars through the solders.

12. The semiconductor structure of claim 7, further comprising:
    an another alignment mark on a back side of the substrate opposite to a front side which the plurality of pillars are in;
    an another plurality of pillars on the back side of the substrate;
    an another seal wall surrounding the another alignment mark on the back side of the substrate, wherein the another seal wall is between the another plurality of pillars and the another alignment mark;
    an another plurality of solders on the another plurality of pillars; and
    an another device with another vias connecting to the another plurality of pillars through the another plurality of solders.

13. A method for forming a semiconductor structure comprising:
    forming an alignment mark in the substrate;
    forming a seal wall surrounding the alignment mark in the substrate;
    forming a plurality of pillars outside the seal wall in the substrate, wherein a group of the plurality of pillars is formed to have an average height different from an average height of an another group of the plurality of pillars;
    forming a plurality of solders on the plurality of pillars;
    aiming a nozzle at and jetting flux to the group of the plurality of pillars; and
    providing a device with vias to connect to the plurality of pillars through the plurality of solders.

14. The method of claim 13, wherein the group of the plurality of pillars is formed to have a pattern density different from the pattern density of the another group of the plurality of pillars.

15. The method of claim 13, further comprising:
    forming the average height of the group of the plurality of pillars 1~20% shorter than the average height of the another group of the plurality of pillars.

16. The method of claim 13, further comprising:
    forming a pattern density of the group of the plurality of pillars 1~20% more than a pattern density of the another group of the plurality of pillars.

17. The method of claim 13, further comprising programming a path of the nozzle to jet the flux before aiming the nozzle at and jetting flux to the group of the plurality of pillars.

18. The method of claim 13 wherein the seal wall are formed by in-situ plating.

19. The method of claim 13 wherein the forming the seal wall and the forming the plurality of pillars are in the same duration.

20. The method of claim 19, further comprising:
    forming an another alignment mark on a back side of the substrate opposite to a front side which the plurality of pillars are in;
    forming an another plurality of pillars on the back side of the substrate;
    forming an another seal wall surrounding the another alignment mark on the back side of the substrate wherein the another seal wall is between the another plurality of pillars and the another alignment mark;
    forming an another plurality of solders on the another plurality of pillars;
    jetting flux to the another plurality of pillars; and
    providing an another device with another vias to connect to the another plurality of pillars through the another plurality of solders.

* * * * *